(12) United States Patent
Schooley et al.

(10) Patent No.: US 9,337,787 B2
(45) Date of Patent: May 10, 2016

(54) POWER AMPLIFIER WITH IMPROVED LOW BIAS MODE LINEARITY

(71) Applicant: RF Micro Devices, Inc., Greensboro, NC (US)

(72) Inventors: Derek Schooley, Oak Ridge, NC (US); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/304,149

(22) Filed: Jun. 13, 2014

(65) Prior Publication Data

US 2014/0375390 A1    Dec. 25, 2014

Related U.S. Application Data

(60) Provisional application No. 61/836,744, filed on Jun. 19, 2013.

(51) Int. Cl.
*H03G 3/30* (2006.01)
*H03F 3/21* (2006.01)
*H03F 1/02* (2006.01)
*H03F 3/191* (2006.01)

(52) U.S. Cl.
CPC ............... *H03F 3/21* (2013.01); *H03F 1/0261* (2013.01); *H03F 3/191* (2013.01); *H03F 2200/18* (2013.01); *H03F 2200/27* (2013.01); *H03F 2200/451* (2013.01); *H03G 3/30* (2013.01)

(58) Field of Classification Search
CPC ....... H03F 3/72; H03F 1/0277; H03F 1/0261; H03F 1/302; H03F 2200/18; H03F 1/301; H03F 1/30; H03F 2200/451; H03F 3/193; H03F 1/223; H03F 3/195; H03F 3/19; H03F 3/21; H03F 1/0205; H03F 1/086; H03F 3/213; H03F 3/45179; H03F 1/342; H03F 2003/45008; H03G 1/0088; H03G 3/3042; H03G 3/3047
USPC ............................................. 330/51, 285, 296
See application file for complete search history.

(56) References Cited

U.S. PATENT DOCUMENTS 7,439,808 B2 * 10/2008 Inamori et al. ................ 330/296
8,981,849 B2 *  3/2015 Song ............................. 330/285
8,994,453 B2 *  3/2015 Won et al. ..................... 330/289

* cited by examiner

*Primary Examiner* — Khanh V Nguyen
(74) *Attorney, Agent, or Firm* — Withrow & Terranova, P.L.L.C.

(57) ABSTRACT

Power amplifier circuitry includes a power amplifier including an input node and an output node, biasing circuitry, a selectable impedance network, and an input capacitor. The input capacitor is coupled to the input node of the power amplifier. The biasing circuitry is coupled to the input node of the power amplifier through the selectable impedance network. The power amplifier is operable in a low power operating mode and a high power operating mode. In the low power operating mode, the biasing circuitry delivers a first biasing current to the input node of the power amplifier, and a first impedance level of the selectable impedance is selected. In the high power operating mode, the biasing circuitry delivers a second biasing current to the input node of the power amplifier, and a second impedance level of the selectable impedance is selected.

28 Claims, 7 Drawing Sheets

POWER AMPLIFIER WITH IMPROVED LOW BIAS MODE LINEARITY

RELATED APPLICATIONS

This application claims the benefit of U.S. provisional patent application Ser. No. 61/836,744, filed Jun. 19, 2013, the disclosure of which is incorporated herein by reference in its entirety.

FIELD OF THE DISCLOSURE

The present disclosure relates to radio frequency (RF) power amplifier circuitry. Specifically, the present disclosure relates to RF power amplifier circuitry, which allows a power amplifier to operate at multiple bias levels while maintaining a high degree of linearity.

BACKGROUND

As consumer demand for wireless communications devices with extended battery life continues to increase, power dissipation has become a major concern for device manufacturers. A major contributor to the power dissipation of many wireless communications devices is the power amplifier. Because the efficiency of a power amplifier is inversely proportional to the power dissipation thereof, increasing the efficiency of a wireless communications device results in a decrease in the power dissipation of the device.

Current wireless communications standards require a wireless communications device to operate at a number of predefined output power levels. These power levels are selected by the wireless communications device depending on the propagation characteristics of the RF channel in use. For example, the 2G Enhanced Data Rates for GSM Evolution (EDGE) standard requires output power levels ranging from 5 dBm to 27 dBm in 2 dB steps for signals transmitted in the GSM-850 or GSM-900 frequency bands by a Class E2 mobile station and requires output power levels ranging from 0 dBm to 26 dBm in 2 dB steps in the Digital Communications Standard (DCS) and Personal Communications Standard (PCS) frequency bands by a Class E2 mobile station. In another example the 3G Wideband Code Division Multiple Access (WCDMA) standard requires output power levels ranging from less than −50 dBm to +27 dBm in steps as small as 1 dB for Class 2 User Equipment (UE).

Most modern cellular systems such as EDGE and WCDMA further require that the radio transmission system be reasonably linear. Thus the ratio of output power to input power, or gain, should be reasonably constant over the output power range traversed by the amplitude of the modulation signal.

One method of improving the efficiency of a power amplifier at low power levels is to reduce the quiescent current delivered to the power amplifier. Accordingly, many modern power amplifiers are designed to operate with several selectable DC bias levels that reduce the quiescent current as the output power level is reduced. However, as the quiescent current is reduced, the linearity of a power amplifier is degraded at higher power levels. One mechanism that degrades the linearity of the power amplifier is rectification of an RF input signal delivered to the power amplifier. Rectification of the RF input signal contributes to the DC bias level and thus increases the gain as the RF input signal level increases. This effect is typically referred to as "gain peaking," and is a limiting factor in the efficiency achievable by conventional power amplifiers.

Accordingly, there is a present need for an RF power amplifier architecture that allows operation at low quiescent current levels while minimizing variations in gain.

SUMMARY

The present disclosure relates to radio frequency (RF) power amplifier circuitry, which allows a power amplifier to operate at multiple bias levels while maintaining a high degree of linearity. In one embodiment, the power amplifier circuitry includes a power amplifier including an input node and an output node, biasing circuitry, a selectable impedance network, and an input capacitor. The input capacitor is coupled to the input node of the power amplifier, such that the power amplifier is configured to receive an RF input signal through the input capacitor. The biasing circuitry is coupled to the input node of the power amplifier through the selectable impedance network. The power amplifier is operable in a low power operating mode and a high power operating mode. In the low power operating mode, the biasing circuitry delivers a first biasing current to the input node of the power amplifier through a first impedance in the selectable impedance network. In the high power operating mode, the biasing circuitry delivers a second biasing current to the input node of the power amplifier through a second impedance in the selectable impedance network.

In one embodiment, the power amplifier is configured to amplify the RF input signal to an appropriate level and deliver the amplified RF input signal to the output node.

In one embodiment, the first biasing current is significantly smaller than the second biasing current. By delivering a smaller biasing current to the input node of the power amplifier in the low power operating mode, the overall power dissipation of the power amplifier can be reduced, thereby increasing the efficiency of the power amplifier circuitry.

In one embodiment, the first impedance level is significantly larger than the second impedance level. The larger impedance level in the low power operating mode limits the charge available to the input capacitor, which in turn reduces the effective value of the input capacitor and thus increases the impedance of the input capacitor as the signal level of the RF input signal increases. Since the input capacitor forms a voltage divider with the active element of the power amplifier, the gain of the power amplifier is reduced as the input signal level increases. Accordingly, the gain increase experienced by the power amplifier due to rectification of the input signal as the input signal level increases is counteracted, thereby maintaining the linearity of the power amplifier. In the high power operating mode, the rectification of the input signal does not have as much effect on the gain of the power amplifier. The impedance used to couple the bias network to the power amplifier is thus reduced in the high power operating mode to avoid a net reduction in gain as the input signal level increases.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
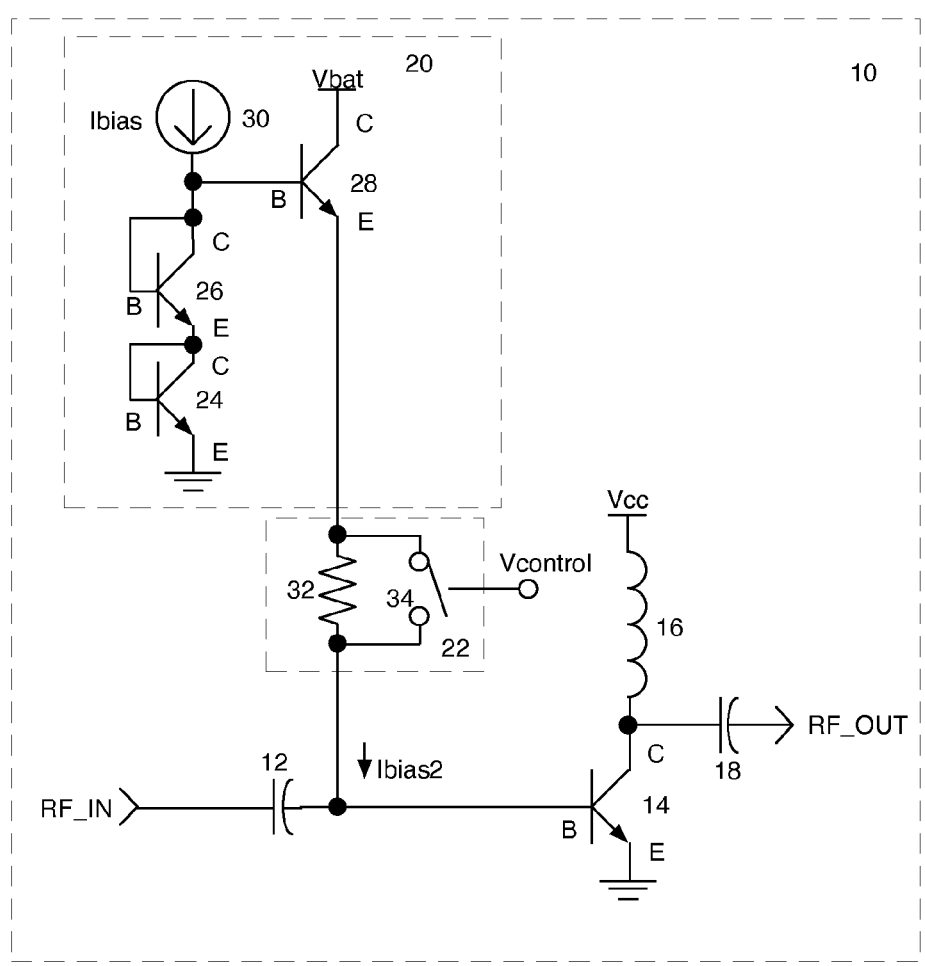
FIG. 1 illustrates exemplary power amplifier circuitry according to one embodiment of the present invention.

FIG. 1 shows power amplifier circuitry 10 according to one embodiment of the present disclosure. The power amplifier circuitry 10 includes an input capacitor 12, an RF transistor 14, a supply inductor 16, an output capacitor 18, biasing circuitry 20, and a selectable impedance network 22. An RF input signal RF_IN is delivered to a base contact (B) of the RF transistor 14 through the input capacitor 12. Further, the biasing circuitry 20 is coupled to the base contact (B) of the RF transistor 14 through the selectable impedance network 22. An emitter contact (E) of the RF transistor 14 is connected to ground. A collector contact (C) of the RF transistor 14 is coupled through the supply inductor 16 to a supply voltage Vcc. The supply inductor 16 provides a DC current path to the collector contact (C) of the RF transistor 14, and also forms a tuned impedance transformation network in conjunction with the output capacitor 18. The output capacitor 18 is also coupled to the collector contact (C) of the RF transistor 14, and receives an RF output signal RF_OUT from the RF transistor 14.

The power amplifier circuitry 10 is configured to operate in a low power operating mode and a high power operating mode. In the low power operating mode, a first biasing current is delivered to the base contact (B) of the RF transistor 14 through a first impedance in the selectable impedance network 22. In the high power operating mode, a second biasing current is delivered to the base contact (B) of the RF transistor 14 through a second impedance in the selectable impedance network 22. The first biasing current is significantly smaller than the second biasing current, while the first impedance level is significantly larger than the second impedance level. Operating the power amplifier circuitry 10 in this manner increases the efficiency of the power amplifier circuitry 10 by reducing the quiescent current thereof, while simultaneously maintaining the linearity of the RF transistor 14, as discussed in further detail below.

The quiescent collector current drawn by the RF transistor 14 is determined by the quiescent base current (shown as Ibias 2) multiplied by the current gain (i.e., Beta) of the RF transistor 14. The quiescent base current of the RF transistor 14 is determined by the biasing circuitry 20 and the selectable impedance network 22. The biasing circuitry 20 includes a first diode connected transistor 24, a second diode connected transistor 26, a bias transistor 28, and a biasing current source 30.

The collector contact (C) of the first diode connected transistor 24 is connected to a biasing current source 30, as well as a base contact (B) of the first diode connected transistor 24. An emitter contact (E) of the first diode connected transistor 24 is coupled to the collector contact (C) of the second diode connected transistor 26. A collector contact (C) of the second diode connected transistor 26 is also connected to base contact (B) of the second diode connected transistor 26. Finally, an emitter contact (E) of the second diode connected transistor 26 is coupled to ground. The particular configuration of the first diode connected transistor 24 and the second diode connected transistor 26 is commonly referred to as a diode stack. This diode stack is biased with a biasing current Ibias, which is delivered by the biasing current source 30 such that a voltage is formed at the top of the diode stack.

The voltage formed at the top of the diode stack is applied to a base contact (B) of the bias transistor 28. An emitter contact (E) of the bias transistor 28 is connected in series with the selectable impedance network 22 and the base contact (B) of the RF transistor 14. The first diode connected transistor 24 and the second diode connected transistor 26, the bias transistor 28, and the RF transistor 14, form a current mirror such that the quiescent collector current of the RF transistor 14 is related to the current provided by the biasing current source 30 by Equation (1) shown below.

$$\left(\frac{Ibias - \frac{IC_{14}}{\beta^2}}{IC_{14}}\right)^2 \frac{A_{28}A_{14}}{A_{24}A_{26}}\beta = e^{\frac{z_{22}IC_{14}}{\beta V_T}} \quad (1)$$

Where $A_{14}$, $A_{24}$, $A_{26}$, and $A_{28}$ are the emitter areas of the RF transistor 14, the first and second diode connected transistors 24 and 26, and the bias transistor 28, respectively, $Z_{22}$ is the impedance of the selectable impedance network 22, $IC_{14}$ is the collector current of the RF transistor 14, $\beta$ is the current gain of the transistors, and $V_T$ is the thermal voltage or 26 mV at room temperature.

If $\beta$ is large and if the impedance of the selectable impedance network 22 is small then this expression simplifies to Equation (2) shown below.

$$IC_{14} = \left(\sqrt{\frac{A_{28}A_{14}}{A_{24}A_{26}}\beta}\right) * Ibias \quad (2)$$

Accordingly, the quiescent collector current of the RF transistor 14 is determined by the value of the biasing current Ibias delivered by the biasing current source 30 multiplied by the square root of the ratio of the product of the emitter area of the RF transistor 14 and the emitter area of the bias transistor 28 divided by the product of the emitter area of the first diode connected transistor 24 and the emitter area of the second diode connected transistor 26.

The selectable impedance network 22 may include a resistor 32 and a single pole single throw (SPST) switch 34. In the low power operating mode of the power amplifier circuitry 10, the SPST switch 34 is programmed to an open circuit state by a control signal Vcontrol. In the high power operating mode of the power amplifier circuitry 10, the SPST switch 34 is programmed to a closed circuit state by the control signal Vcontrol.

Figure 2:
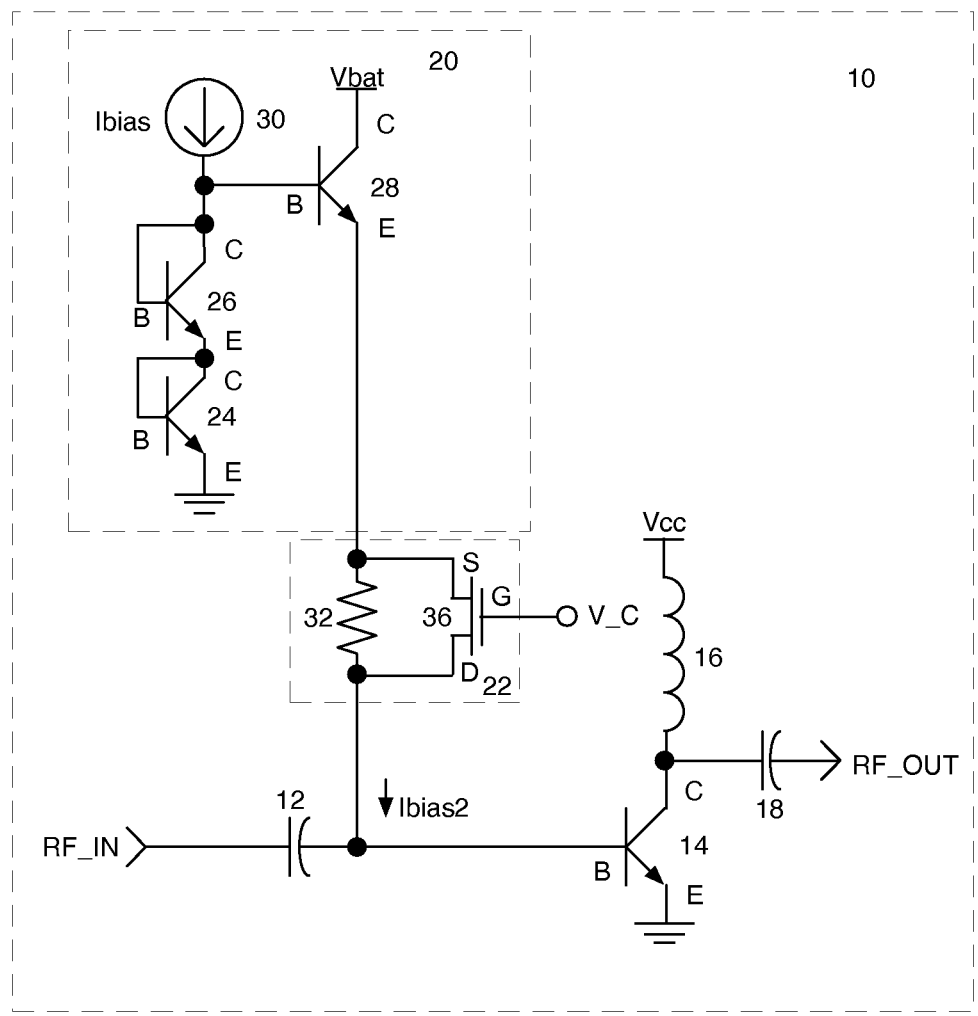
FIG. 2 illustrates the exemplary power amplifier circuitry according to an additional embodiment of the present disclosure.

FIG. 2 shows the power amplifier circuitry 10 wherein the SPST switch 34 is replaced by an NFET 36. In this configuration, the control signal Vcontrol is delivered to a gate contact (G) of the NFET 36. The control signal Vcontrol is set to a high state in the high power operating mode, which causes the NFET 36 to turn on and create a low impedance path across the resistor 32. In the low power operating mode, the control signal Vcontrol is set to a low state, which causes the NFET 36 to turn off and thus present the full impedance of the resistor 32 to the biasing circuitry 20.

FIGS. 3A, 3B, 3C, 3D, 3E, and 3F show various current and voltage waveforms from the power amplifier circuitry 10 for an RF input signal RF_IN signal level that is large enough to result in significant deviations from quiescent conditions.

Figure 3A:
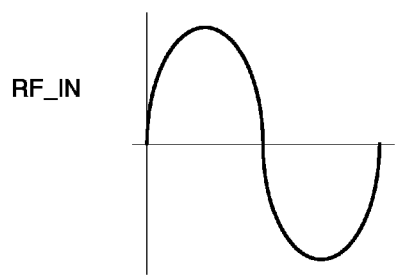
FIGS. 3A-3F are a series of graphs depicting the voltage and current at various points within the exemplary power amplifier circuitry.
Figure 3D:
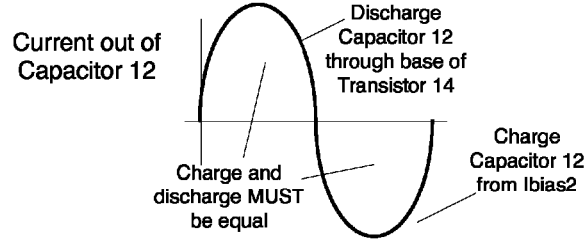
Figure 3B:
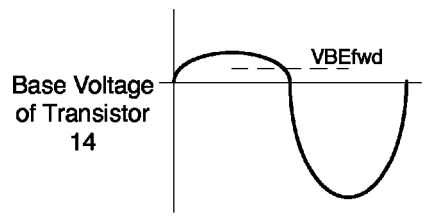

FIG. 3A shows the RF input signal RF_IN as a reference RF sinusoidal waveform. As shown in FIG. 3A, as the RF input signal RF_IN increases, the voltage at the base contact (B) of the RF transistor 14 also increases, but is limited by the base emitter forward diode drop of the RF transistor 14, as shown in FIG. 3B. This results in a large current flowing out of the input capacitor 12 into the base contact (B) of the RF transistor 14, as shown in FIG. 3C and FIG. 3D.

Figure 3E:
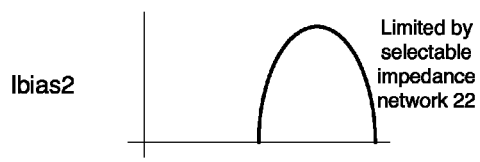
Figure 3C:
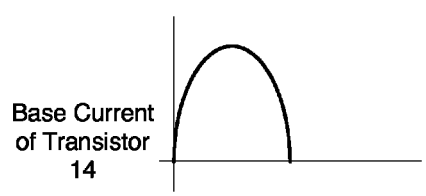

FIG. 3E shows a second biasing current Ibias2, which flows from the emitter contact (E) of the bias transistor 28 through the selectable impedance network 22. When the voltage of the RF input signal RF_IN, and thus the voltage at the base contact (B) of the RF transistor 14, increases, the voltage at the emitter contact (E) of the bias transistor 28 also increases. Practically no current flows through the selectable impedance network 22 because the base emitter junction of the bias transistor 28 is turned off.

Figure 3F:
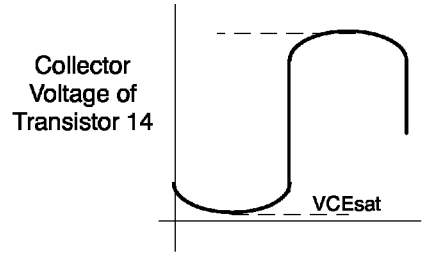

FIG. 3F shows the voltage at the collector contact (C) of the RF transistor 14. The voltage at the collector contact (C) of the RF transistor 14 falls to the collector emitter saturation voltage, VCEsat, when the base contact (B) of the RF transistor 14 is driven with a large current on the positive excursion of the RF input signal RF_IN. This voltage is very close to 0V.

When the voltage of the RF input signal RF_IN becomes negative in FIG. 3A, the voltage at the base contact (B) of the RF transistor 14 also becomes negative, as shown in FIG. 3B. This is not limited by the base emitter junction of the RF transistor 14, because the junction is turned off. When the RF transistor 14 turns off, the collector voltage rises to approximately twice the DC supply voltage as shown in FIG. 3F. This is because the average DC voltage across an inductor must be zero and thus if the output waveform is symmetrical then the positive excursion of the output waveform must equal the negative excursion of the output waveform with an average voltage of the DC supply.

Since the negative excursion is equal to the collector emitter saturation voltage of approximately zero volts, the positive excursion is equal to approximately twice the supply voltage, Vcc, so that the average voltage is Vcc.

Figure 4:
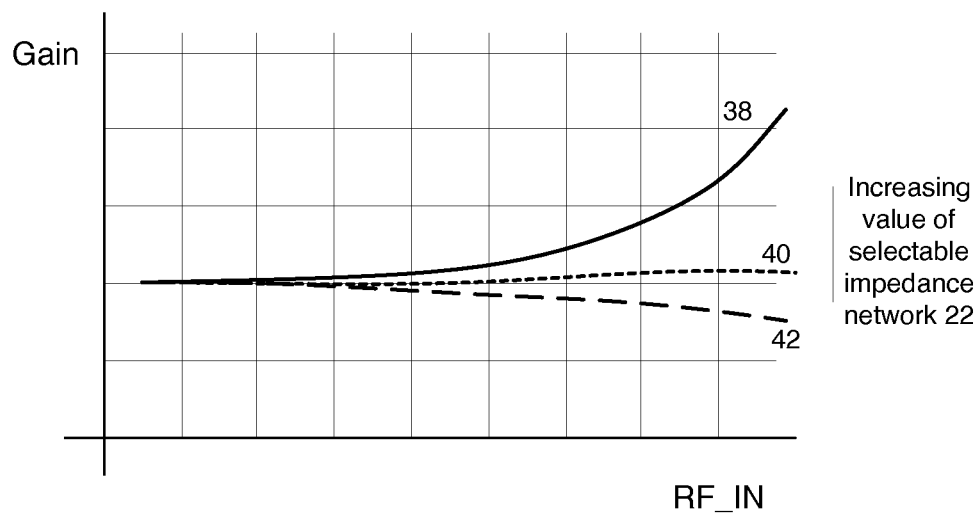
FIG. 4 is a graph of the gain of the exemplary power amplifier circuitry as a function of the input signal level.

Note that the waveform of base current shown in FIG. 3C is highly asymmetrical for a large level of the RF input signal RF_IN. This asymmetrical waveform will contain a significant component at DC and thus the effective quiescent current is increased as the level of the input signal RF_IN increases. This effect is known as rectification of the input signal. Such an increase in the quiescent current will result in an increase in the gain as the level of the input signal RF_IN increases as shown by a plot with positive gain slope 38 shown in FIG. 4, which results in degraded linearity of the RF amplifier.

Additionally, when the voltage of the RF input signal RF_IN becomes negative, the base voltage of the RF transistor 14 also becomes negative and the second biasing current Ibias2 increases as shown in FIG. 3E. The second biasing current Ibias2 charges the input capacitor 12 to replace the charge removed during the positive cycle of the RF input signal RF_IN as shown in FIG. 3C.

Since a capacitor cannot pass DC current, the total charge removed from the input capacitor 12 to drive the base of the RF transistor 14 on the positive excursion of the RF input signal RF_IN must be replaced by the second biasing current Ibias2 flowing through the selectable impedance network 22 into the input capacitor 12 on the negative excursion of the RF input signal RF_IN, as shown in FIG. 3D.

The second biasing current Ibias2 flowing through the selectable impedance network 22 can be significantly large for large levels of the input signal RF_IN. If the impedance value of the selectable impedance network 22 is intentionally increased, the second biasing current Ibias2 will be limited and the charge removed from the input capacitor 12 on the positive excursion of the RF input signal RF_IN will not be fully replaced by the current provided from the second biasing current Ibias2 on the negative excursion of the RF input signal RF_IN. Accordingly, on the next positive excursion of the RF input signal RF_IN, the input capacitor 12 will not be able to provide as much current into the base contact (B) of the RF transistor 14. This effectively reduces the capacitance of the input capacitor 12 as the level of the RF input signal RF_IN increases.

If the effective value of capacitance of the input capacitor 12 is reduced as the level of the RF input signal RF_IN increases, the impedance of the input capacitor 12 increases. The impedance of the input capacitor 12 forms a voltage divider with the base emitter junction of the RF transistor 14. Accordingly, as the impedance of the input capacitor 12 increases, the effect of the RF input signal RF_IN on the base emitter junction of the RF transistor 14 is reduced. This in turn reduces the gain of the power amplifier circuitry 10 at higher input signal levels and thus counteracts the increase in gain due to rectification of the input signal. A plot with essentially zero gain slope 40 and a plot with negative gain slope 42 shown in FIG. 4 demonstrate how the gain increase, which occurs with an increase in the level of the RF input signal RF_IN as shown by the plot with a positive gain slope 38, can be mitigated by increasing the impedance value of the selectable impedance network 22. An optimum impedance value of the selectable impedance network 22 is represented by the plot with essentially zero slope 42.

Typical power amplifiers have multiple power ranges in which the bias current is varied. At low power ranges, the bias current is reduced and rectification of the input signal can result in increasing gain with an increase in the level of the RF input signal RF_IN as shown in the plot with a positive gain slope 38 of FIG. 4. This gain variation can be reduced by increasing the impedance value of the selectable impedance network 22 as shown in the plot with essentially zero gain slope 40 of FIG. 4. Increasing the impedance of the selectable impedance network 22 can be accomplished by opening the switch 34 or turning off the NFET 36.

At high power ranges, the bias current is typically increased and thus rectification of the input signal will not significantly increase the effective bias current until much higher power levels. In addition, at high power ranges, the output power at the highest power levels is typically limited by the supply voltage of the collector and thus the gain of the power amplifier in the high power ranges decreases as the level of the RF input signal RF_IN increases. Therefore, it is desirable to decrease the impedance of the selectable impedance network 22 in the high power ranges. Decreasing the impedance of the selectable impedance network 22 can be accomplished by closing the switch 34 or turning on the NFET 36.

Figure 5:
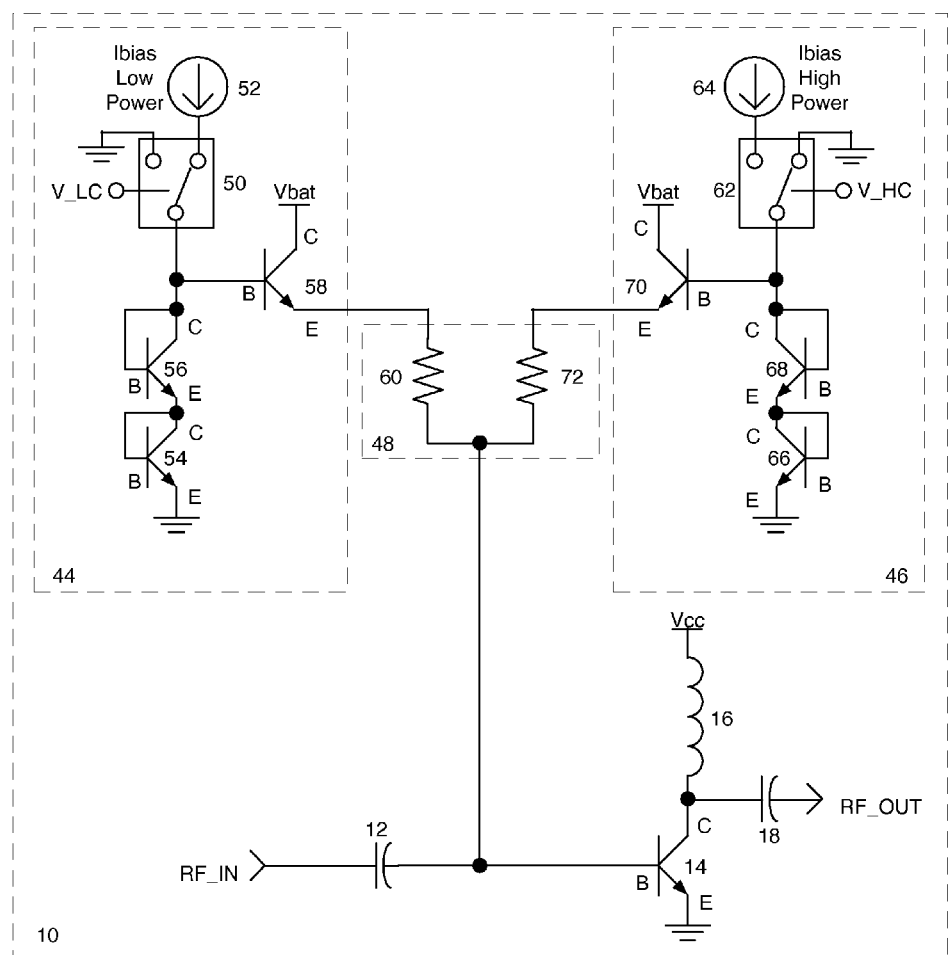
FIG. 5 illustrates the exemplary power amplifier circuitry according to an additional embodiment of the present disclosure.

FIG. 5 shows the power amplifier circuitry 10 according to an additional embodiment of the present disclosure. The power amplifier circuitry 10 shown in FIG. 5 is substantially similar to that shown in FIG. 1, but includes low power operating mode biasing circuitry 44 and high power operating mode biasing circuitry 46 in place of the biasing circuitry 20, and includes a dual path selectable impedance network 48 in place of the selectable impedance network 22. The low power operating mode biasing circuitry 44 includes a first single pole dual throw (SPDT) switch 50, a low power operating mode current source 52, a first diode connected transistor 54, a second diode connected transistor 56, and a low power biasing transistor 58. The first diode connected transistor 54 and the second diode connected transistor 56 are coupled in series between a base contact (B) of the low power biasing transistor 58 and ground to form a first biasing stack. Specifically, an emitter contact (E) of the first diode connected transistor 54 is coupled to ground, a base contact (B) of the first diode connected transistor 54 is coupled to a collector contact (C) of the first diode connected transistor 54, which is in turn coupled to an emitter contact (E) of the second diode connected transistor 56. A base contact (B) of the second diode connected transistor 56 is coupled to a collector contact (C) of the second diode connected transistor 56, which is in turn coupled to the base contact (B) of the low power biasing transistor 58. The first SPDT switch 50 is coupled between the low power operating mode current source 52, the base contact (B) of the low power biasing transistor 58, and ground, such that one of a biasing current from the low power operating mode current source 52 or ground will be delivered to the base contact (B) of the low power biasing transistor 58, depending on the level of the low power bias control signal V_LC. A collector contact (C) of the low power biasing transistor 58 is coupled to a supply voltage Vbat. Finally, an emitter contact (E) of the low power biasing transistor 58 is coupled to the base contact (B) of the RF transistor 14 through a first impedance 60 in the dual path selectable impedance network 48.

The high power operating mode biasing circuitry 46 includes a second SPDT switch 62, a high power operating mode current source 64, a third diode connected transistor 66, a fourth diode connected transistor 68, and a high power biasing transistor 70. The third diode connected transistor 66 and the fourth diode connected transistor 68 are coupled in series between a base contact (B) of the low power biasing transistor 58 and ground to form a second diode stack. Specifically, an emitter contact (E) of the third diode connected transistor 66 is coupled to ground, a base contact (B) of the third diode connected transistor 66 is coupled to a collector contact (C) of the third diode connected transistor 66, which is in turn coupled to an emitter contact (E) of the fourth diode connected transistor 68. A base contact (B) of the fourth diode connected transistor 68 is coupled to a collector contact (C) of the fourth diode connected transistor 68. The second SPDT switch 62 is coupled between the high power operating mode current source 64, the base contact (B) of the high power biasing transistor 70, and ground, such that one of a biasing current from the high power operating mode current source 64 or ground will be delivered to the base contact (B) of the high power biasing transistor 70, depending on the level of the high power bias control signal V_HC. A collector contact (C) of the high power biasing transistor 70 is coupled to a supply voltage Vbat. Finally, an emitter contact (E) of the high power biasing transistor 70 is coupled to the base contact (B) of the RF transistor 14 through a second impedance 72 in the dual path selectable impedance network 48.

Similar to the power amplifier circuitry 10 shown in FIG. 1, the power amplifier circuitry 10 shown in FIG. 5 is also operable in both a low power operating mode and a high power operating mode. In the low power operating mode, the low power operating mode biasing circuitry 44 is activated by the low power bias control signal V_LC. Specifically, the low power bias control signal V_LC is delivered to the first SPDT switch 50, which causes the first SPDT switch 50 to pass the biasing current from the low power operating mode current source 52 to the first diode stack including the first diode connected transistor 54 and the second diode connected transistor 56. At the same time, the high power operating mode biasing circuitry 46 is de-activated by the high power bias control signal V_HC. Specifically, the high power bias control signal V_HC is delivered to the second SPDT switch 62, such that the second SPDT switch 62 is selected to connect the second diode stack including the third diode connected transistor 66 and the fourth diode connected transistor 68 to ground. Thus, the RF transistor 14 is biased in a current mirror configuration using the first diode connected transistor 54, the second diode connected transistor 56, the low power biasing transistor 58, the first impedance 60 in the dual path selectable impedance network 48, and the low power operating mode current source 52. The first impedance 60 is relatively large, such that the gain of the power amplifier circuitry 10 is decreased as the input signal RF_IN increases in the low power operating mode.

In the high power operating mode the high power operating mode biasing circuitry 46 is activated by the high power bias control signal V_HC with the second SPDT switch 62 selected to pass the current from a high power operating mode current source 64 to the second diode stack including the third diode connected transistor 66 and the fourth diode connected transistor 68. At the same time the low power operating mode biasing circuitry 44 is de-activated by the low power bias control signal V_LC, such that the first SPDT switch 50 is selected to connect the first diode stack including the first diode connected transistor 54 and the second diode connected transistor 56 to ground. Thus the RF transistor 14 is biased in a current mirror configuration using the third diode connected transistor 66, the fourth diode connected transistor 68, the high power biasing transistor 70, the second impedance 72 in the dual path selectable impedance network 48, and the high power operating mode current source 64. The second impedance 72 is relatively small, such that the gain of the power amplifier circuitry 10 is not decreased significantly as the input signal RF_IN increases in the high power operating mode.

Figure 6:
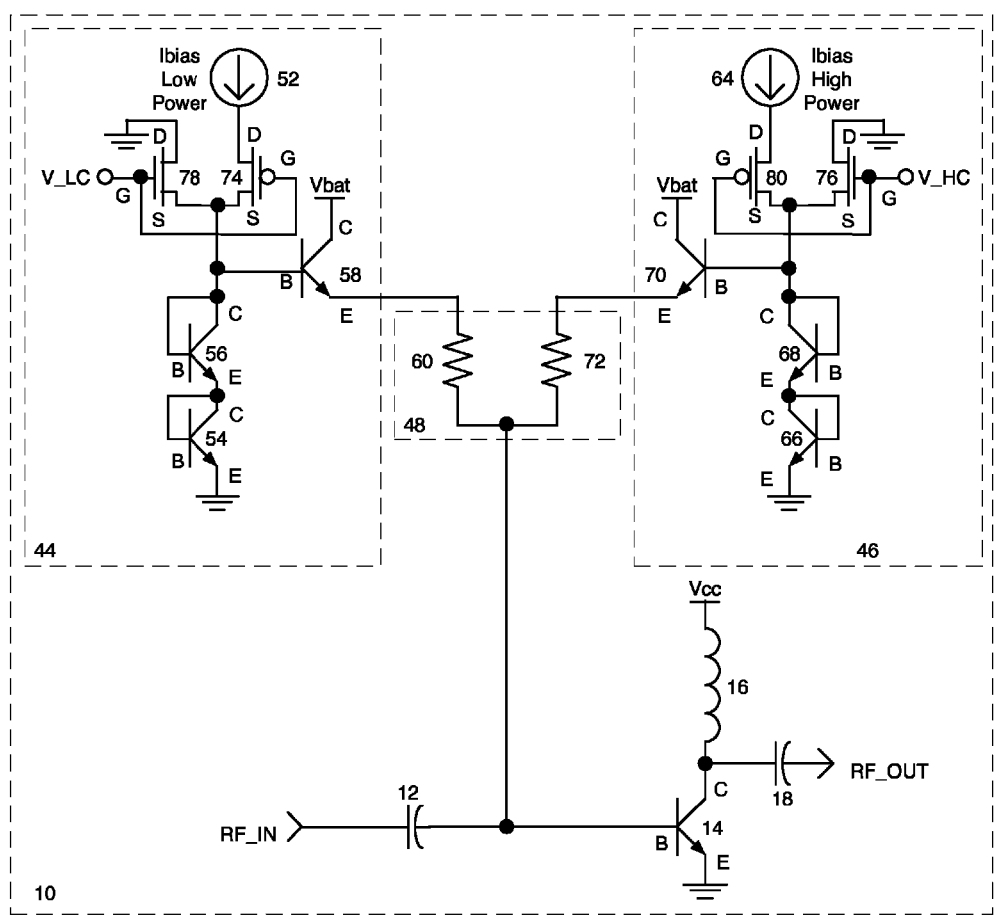
FIG. 6 illustrates the exemplary power amplifier circuitry according to an additional embodiment of the present disclosure.

FIG. 6 presents the circuit shown in FIG. 5 where the first SPDT switch 50 and the second SPDT switch 62 are replaced by Field Effect Transistors (FETs). A first low power mode bias FET 74 and a first high power mode bias FET 76 are p-type devices and as such will be on if the gate connections are connected to ground. A second low power mode bias FET 78 and a second high power mode bias FET 80 are n-type devices and as such will be on if the gate connections are connected to supply.

A gate contact (G) of the first low power mode bias FET 74 is connected to a gate contact (G) of the second low power mode bias FET 78 and configured to receive the low power bias control signal V_LC. If the low power bias control signal V_LC is above a predetermined threshold (e.g., equal to the supply voltage), the second low power mode bias FET 78 is on, which shorts the first diode stack including the first diode connected transistor 54 and the second diode connected transistor 56 to ground. At the same time the first low power mode bias FET 74 is off so that the low power operating mode current source 52 is disconnected from the first diode stack including the first diode connected transistor 54 and the second diode connected transistor 56.

If the low power bias control signal V_LC is below a predetermined threshold (e.g., equal to ground), the second low power mode bias FET 78 is off and the first low power mode bias FET 74 is on thus connecting the low power operating mode current source 52 to the first diode stack including the first diode connected transistor 54 and the second diode connected transistor 56. Thus the RF transistor 14 is biased in a current mirror configuration using the first diode connected transistor 54, the second diode connected transistor 56, the low power biasing transistor 58, the low power operating mode current source 52, and the second impedance 72 of the dual path selectable impedance network 48.

A gate contact (G) of the first high power mode bias FET 76 is connected to a gate contact (G) of the second high power mode bias FET 80 and configured to receive the high power bias control signal V_HC. If the high power bias control signal V_HC is above a predetermined threshold (e.g., equal to the supply voltage), the second high power mode bias FET 80 is on, which shorts the second diode stack including the third diode connected transistor 66 and the fourth diode connected transistor 68 to ground. At the same time the first high power mode bias FET 76 is off so that the high power operating mode current source 64 is disconnected from the second diode stack including the third diode connected transistor 66 and the fourth diode connected transistor 68.

If the high power bias control signal V_HC is below a predetermined threshold (e.g., equal to ground), the second high power mode bias FET 80 is off and the first high power mode bias FET 76 is on thus connecting the high power operating mode current source 64 to the second diode stack including the third diode connected transistor 66 and the fourth diode connected transistor 68. Thus the RF transistor 14 is biased in a current mirror configuration using the third diode connected transistor 66, the fourth diode connected transistor 68, the high power biasing transistor 70, the high power operating mode current source 64, and the second impedance 72 of the dual path selectable impedance network 48.

The low power bias control signal V_LC and the high power bias control signal V_HC may be complimentary digital signals such that only one of either the low power operating mode biasing circuitry 44 or the high power operating mode biasing circuitry 46 is active at any given time.

Figure 7:
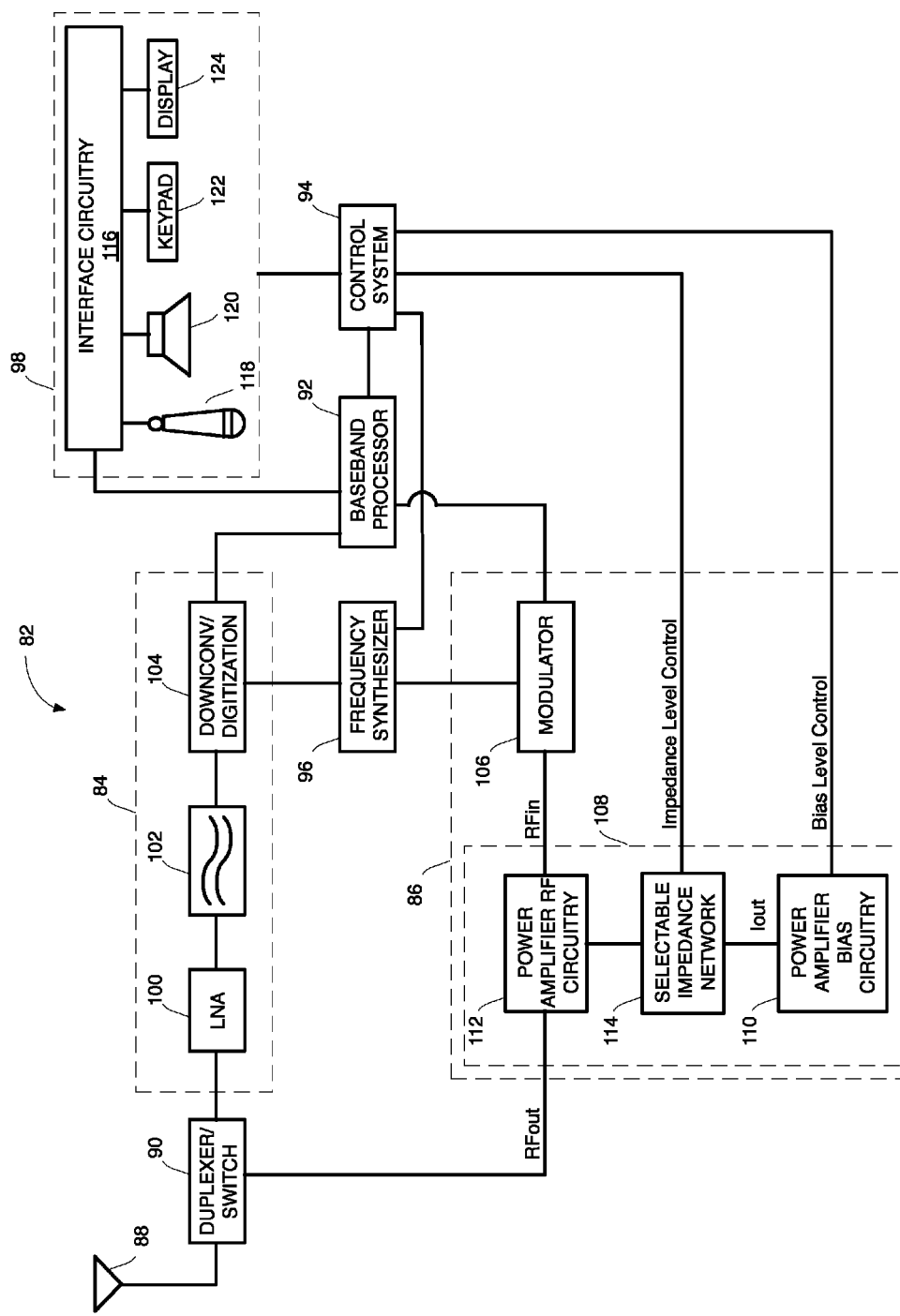
FIG. 7 depicts a mobile terminal incorporating the exemplary power amplifier circuitry according to one embodiment of the present disclosure.

With reference to FIG. 7, an embodiment of the present disclosure is preferably incorporated in a mobile terminal 82 such as a mobile telephone, personal digital assistant (PDA), or the like. The basic architecture of the mobile terminal 82 may include a receiver front end 84, an RF transmitter section 86, an antenna 88, a duplexer or switch 90, a baseband processor 92, a control system 94, a frequency synthesizer 96, and an interface 98. The receiver front end 84 receives information bearing RF signals from one or more remote transmitters provided by a base station. A low noise amplifier (LNA) 100 amplifies the signal. A filter circuit 102 minimizes broadband interference in the received signal, while a downconverter 104 down-converts the filtered received signal to an intermediate or baseband frequency signal, which is then digitized into one or more digital streams. The receiver front end 84 typically uses one or more mixing frequencies generated by the frequency synthesizer 96.

The baseband processor 92 processes the digitized received signal to extract the information or data bits conveyed in the received signal. This processing typically comprises demodulation, decoding, and error correction operations. As such, the baseband processor 92 is generally implemented in one or more digital signal processors (DSPs).

On the transmit side, the baseband processor 92 receives digitized data from the control system 94, which it encodes for transmission. The encoded data is output to the RF transmitter section 86 where it is used by a modulator 106 to modulate a carrier signal that is at a desired transmit frequency. Power amplifier circuitry 108 amplifies the modulated carrier signal to a level appropriate for transmission from the antenna 88. Power amplifier bias circuitry 110 provides a selectable bias level to power amplifier RF circuitry 112 through a selectable impedance network 114. The value selected for the bias level of the power amplifier circuitry 108 and the value selected for the impedance level of the selectable impedance network 114 depends on the carrier signal level required, as discussed in detail above.

A user may interact with the mobile terminal 82 via the interface 98 which may include interface circuitry 116 associated with a microphone 118, a speaker 120, a keypad 122, and a display 124. The interface circuitry 116 typically includes analog-to-digital converters, digital-to-analog converters, amplifiers, and the like. Additionally, it may include a voice encoder/decoder, in which case it may communicate directly with the baseband processor 92.

The microphone 118 will typically convert audio input, such as the user's voice, into an electrical signal, which is then digitized and passed directly or indirectly to the baseband processor 92. Audio information encoded in the received signal is recovered by the baseband processor 92 and converted by the interface circuitry 116 into an analog signal suitable for driving the speaker 120. The keypad 122 and the display 124 enable the user to interact with the mobile terminal 82 inputting numbers to be dialed, address book information, or the like, as well as monitoring call progress information.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   a power amplifier including an input node and an output node;
   an input capacitor coupled to the input node of the power amplifier, such that the power amplifier is configured to receive an RF input signal via the input capacitor;
   a selectable impedance network comprising:
      a first selectable impedance node;
      a second selectable impedance node coupled to the input node of the power amplifier;
      an impedance element coupled between the first selectable impedance node and the second selectable impedance node;
      a switching element coupled in parallel with the impedance element between the first selectable impedance node and the second selectable impedance node; and
   biasing circuitry coupled to the first selectable impedance node of the selectable impedance network, wherein:
      the circuitry is configured to operate in a low power operating mode in which the biasing circuitry supplies a first biasing current to the input node of the power amplifier through the impedance element in the selectable impedance network; and
      the circuitry is configured to operate in a high power operating mode in which the biasing circuitry supplies a second biasing current to the input node of the power amplifier at least partially through the switching element in the selectable impedance network.

2. The circuitry of claim 1 wherein the power amplifier is configured to amplify the RF input signal and deliver the amplified RF input signal to the output node.

3. The circuitry of claim 1 wherein the first biasing current is less than the second biasing current.

4. The circuitry of claim 1 wherein the impedance provided by the selectable impedance network in the low power operating mode is higher than the impedance provided by the selectable impedance network in the high power operating mode.

5. The circuitry of claim 4 wherein the impedance provided by the selectable impedance network in the high power operating mode is less than half of the impedance provided by the selectable impedance network in the low power operating mode.

6. The circuitry of claim 1 wherein a power range of the RF input signal is between −50 dBm and +15 dBm.

7. The circuitry of claim 6 wherein the power range of the RF input signal is between −20 dBm and +8 dBm.

8. The circuitry of claim 1 wherein the impedance provided by the selectable impedance network in the low power operating mode and the impedance provided by the selectable impedance network in the high power operating mode are primarily resistive impedances.

9. The circuitry of claim 1 wherein:
   the power amplifier is an RF transistor including a base contact, an emitter contact, and a collector contact;
   the input node of the power amplifier is the base contact;
   the output node of the power amplifier is the collector contact; and
   the emitter contact of the power amplifier is coupled to ground.

10. The circuitry of claim 1 wherein the switching element is a transistor.

11. The circuitry of claim 1 wherein the biasing circuitry comprises:
   a biasing current source;
   a first diode including a cathode contact coupled to ground and an anode contact;
   a second diode including a cathode contact coupled to the anode contact of the first diode and an anode contact coupled to the biasing current source; and
   a biasing transistor including a base contact coupled to the anode of the second diode, an emitter contact coupled to the first selectable impedance node of the selectable impedance network, and a collector contact coupled to a power supply.

12. The circuitry of claim 11 wherein the first diode and the second diode are diode connected transistors.

13. The circuitry of claim 1 wherein the value of the impedance provided by the selectable impedance network in the low power operating mode is selected such that the effective capacitance of the input capacitor as the RF input signal level increases is reduced over a defined input power range in the low power operating mode.

14. The circuitry of claim 1 wherein the value of the impedance provided by the selectable impedance network in the high power operating mode is selected such that the effective capacitance of the input capacitor is substantially constant over the defined input power range in the high power operating mode.

15. Circuitry comprising:
   a power amplifier including an input node and an output node;
   an input capacitor coupled to the input node of the power amplifier, such that the power amplifier is configured to receive an RF input signal via the input capacitor;
   a selectable impedance network comprising:
      a first selectable impedance node;
      a second selectable impedance node;
      a third selectable impedance node coupled to the input node of the power amplifier;
      a first impedance element coupled between the first selectable impedance node and the third selectable impedance node;
      a second impedance element coupled between the second selectable impedance node and the third selectable impedance node;
   low power operating mode biasing circuitry coupled to the first selectable impedance node; and
   high power operating mode biasing circuitry coupled to the second selectable impedance node, wherein:
      the circuitry is configured to operate in a low power operating mode in which the low power operating mode biasing circuitry is active to deliver a first biasing current to the input node of the power amplifier through the first impedance element in the selectable impedance network; and the circuitry is configured to operate in a high power operating mode in which the high power operating mode biasing circuitry is active to deliver a second biasing current to the input node of the power amplifier through the second impedance element in the selectable impedance network.

16. The circuitry of claim 15 wherein the power amplifier is configured to amplify the RF input signal and deliver the amplified RF input signal to the output node.

17. The circuitry of claim 15 wherein the first biasing current is less than the second biasing current.

18. The circuitry of claim 15 wherein the first impedance element is larger than the second impedance element.

19. The circuitry of claim 18 wherein the second impedance element is less than half of the first impedance element.

20. The circuitry of claim 15 wherein a power range of the RF input signal is between −50 dBm and +15 dBm.

21. The circuitry of claim 20 wherein the power range of the RF input signal is between −20 dBm and +8 dBm.

22. The circuitry of claim 15 wherein the first impedance element and the second impedance element are resistors.

23. The circuitry of claim 15 wherein:
the power amplifier is an RF transistor including a base contact, an emitter contact, and a collector contact;
the input node of the power amplifier is the base contact;
the output node of the power amplifier is the collector contact; and
the emitter contact of the power amplifier is coupled to ground.

24. The circuitry of claim 15 wherein the low power operating mode biasing circuitry comprises:
a low power operating mode biasing current source;
a first diode including a cathode contact coupled to ground and an anode contact;
a second diode including a cathode contact coupled to the anode contact of the first diode and an anode contact;
a biasing transistor including a base contact coupled to the anode of the second diode, an emitter contact coupled to the first selectable impedance node of the selectable impedance network, and a collector contact coupled to a power supply; and
a first single pole dual throw (SPDT) switch coupled between the low power operating mode biasing current source, the anode contact of the second diode, and ground, such that the first SPDT switch is configured to selectively couple the anode contact of the second diode to one of the low power operating mode biasing current source and ground based on a low power biasing control signal.

25. The circuitry of claim 24 wherein the high power operating mode biasing circuitry comprises:
a high power operating mode biasing current source;
a third diode including a cathode contact coupled to ground and an anode contact;
a fourth diode including a cathode contact coupled to the anode contact of the third diode and an anode contact;
a biasing transistor including a base contact coupled to the anode of the second diode, an emitter contact coupled to the second selectable impedance node of the selectable impedance network, and a collector contact coupled to the power supply; and
a second SPDT switch coupled between the high power operating mode biasing current source, the anode contact of the fourth diode, and ground, such that the second SPDT switch is configured to selectively couple the anode contact of the fourth diode to one of the high power operating mode biasing current source and ground based on a high power biasing control signal.

26. The circuitry of claim 25 wherein the first diode, the second diode, the third diode, and the fourth diode are diode connected transistors.

27. The circuitry of claim 15 where the value of the first impedance element is selected such that the effective capacitance of the input capacitor as the RF input signal level increases is reduced over a defined input power range in the low power operating mode.

28. The circuitry of claim 15 where the value of the second impedance element is selected such that the effective capacitance of the input capacitor is substantially constant over the defined input power range in the high power operating mode.

* * * * *